(12) United States Patent
Lee et al.

(10) Patent No.: US 10,319,880 B2
(45) Date of Patent: Jun. 11, 2019

(54) DISPLAY DEVICE

(71) Applicant: Innolux Corporation, Miao-Li County (TW)

(72) Inventors: Kuan-Feng Lee, Miao-Li County (TW); Yu-Hsien Wu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/499,922

(22) Filed: Apr. 28, 2017

(65) Prior Publication Data
US 2018/0158987 A1 Jun. 7, 2018

Related U.S. Application Data

(60) Provisional application No. 62/441,579, filed on Jan. 3, 2017, provisional application No. 62/429,162, filed on Dec. 2, 2016.

(51) Int. Cl.
*H01L 33/00* (2010.01)
*H01L 27/00* (2006.01)
(Continued)

(52) U.S. Cl.
CPC ............ *H01L 33/16* (2013.01); *H01L 25/167* (2013.01); *H01L 27/156* (2013.01); *H01L 27/32* (2013.01);
(Continued)

(58) Field of Classification Search
CPC ... H01L 27/156; H01L 27/0667; H01L 27/15; H01L 27/24; H01L 29/78675;
(Continued)

(56) References Cited

U.S. PATENT DOCUMENTS 5,793,054 A * 8/1998 Nido ...................... B82Y 20/00
257/103
5,998,807 A 12/1999 Lustig et al.
(Continued)

OTHER PUBLICATIONS

Yamazaki, "A Possibility of Crystalline Indium-Gallium-Zinc-Oxide", 2013, 5th Asia Symposium on Quality Electronic Design, Aug. 26-28, 2013, at IEEE Explorer at Oct. 24, 2014, pp. 1-5.*
(Continued)

*Primary Examiner* — Nikolay K Yushin
(74) *Attorney, Agent, or Firm* — JCIPRNET

(57) ABSTRACT

A display device is provided. The display device includes a substrate, a first transistor, and a light emitting diode. The first transistor is disposed on the substrate, wherein the first transistor comprises a first semiconductor layer comprising silicon having a first lattice constant. The light emitting diode is disposed on the substrate and electrically connected to the first transistor, wherein the light emitting diode comprises a semiconductor layer comprising gallium nitride having a second lattice constant and a third lattice constant, and the third lattice constant is greater than the second lattice constant. A ratio of the second lattice constant to the first lattice constant is greater than or equal to 0.56 and is less than or equal to 0.68.

17 Claims, 3 Drawing Sheets

(51) Int. Cl.
  *H01L 29/00* (2006.01)
  *H01L 33/16* (2010.01)
  *H01L 27/15* (2006.01)
  *H01L 33/06* (2010.01)
  *H01L 33/32* (2010.01)
  *H01L 25/16* (2006.01)
  *H01L 51/00* (2006.01)
  *H01L 27/32* (2006.01)
  H01L 29/786 (2006.01)
  H01L 33/12 (2010.01)

(52) U.S. Cl.
  CPC .............. *H01L 33/06* (2013.01); *H01L 33/32* (2013.01); *H01L 51/00* (2013.01); *H01L 29/7869* (2013.01); *H01L 29/78675* (2013.01); *H01L 33/12* (2013.01)

(58) Field of Classification Search
  CPC . H01L 29/7869; H01L 29/2003; H01L 33/16; H01L 33/06; H01L 33/32; H01L 27/124; H01L 27/1274; H01L 27/14612
  See application file for complete search history.

(56) References Cited

U.S. PATENT DOCUMENTS

| | | | | |
|---|---|---|---|---|
| 6,168,659 | B1* | 1/2001 | Yuri | H01L 21/02381 117/89 |
| 6,661,180 | B2* | 12/2003 | Koyama | G09G 3/3225 315/169.3 |
| 8,513,678 | B2* | 8/2013 | Yamazaki | G09G 3/3208 257/103 |
| 9,560,722 | B2* | 1/2017 | Yue | H01L 25/167 |
| 9,818,765 | B2* | 11/2017 | Osawa | H01L 27/1225 |
| 2002/0135312 | A1* | 9/2002 | Koyama | G09G 3/3225 315/169.3 |
| 2009/0114926 | A1* | 5/2009 | Yamazaki | G09G 3/3208 257/79 |
| 2013/0009111 | A1* | 1/2013 | Morita | H01L 21/02554 252/519.1 |
| 2014/0367633 | A1 | 12/2014 | Bibl et al. | |
| 2015/0001527 | A1 | 1/2015 | Tsang | |
| 2015/0055051 | A1* | 2/2015 | Osawa | H01L 27/1225 349/48 |
| 2016/0163745 | A1 | 6/2016 | Choi et al. | |
| 2016/0323968 | A1* | 11/2016 | Yue | H01L 25/167 |

OTHER PUBLICATIONS

DenBaars et al., "Development of gallium-nitride-based light-emitting diodes (LEDs) and laser diodes for energy efficient lighting and displays", 2013, Acta Materialia vol. 61 pp. 945-951, Dec. 2013.*

Prakash et al., "Comparison of composition and atomic structure of amorphous indium gallium zinc oxide thin film transistor before and after positive bias temperature stress by transmission electron microscopy", 2015, Semicond. Sci. Technol. 30, 055008, pp. 1-8, published Apr. 7, 2015.*

"Search Report of Europe Counterpart Application," dated Feb. 20, 2018, p. 1-p. 10, in which the listed references were cited.

* cited by examiner

DISPLAY DEVICE

CROSS-REFERENCE TO RELATED APPLICATION

This application claims the priority benefits of U.S. provisional application Ser. No. 62/429,162, filed on Dec. 2, 2016 and U.S. provisional application Ser. No. 62/441,579, filed on Jan. 3, 2017. The entirety of each of the above-mentioned patent applications is hereby incorporated by reference herein and made a part of this specification.

BACKGROUND

1. Technical Field

The present disclosure relates to a device, and particularly, relates to a display device.

2. Description of Related Art

Because light emitting diode (LED) display apparatuses have advantages such as active light emitting, high brightness, high contrast ratio, and low power consumption, in recent years, they have become one of technologies, which are vigorously developed, of new displays.

SUMMARY

The present disclosure provides a display device, which is capable of having a better light emitting efficiency.

In one embodiment, the display device of the disclosure includes a substrate, a first transistor, and a light emitting diode. The first transistor is disposed on the substrate, wherein the first transistor comprises a first semiconductor layer comprising silicon having a first lattice constant. The light emitting diode is disposed on the substrate and electrically connected to the first transistor, wherein the light emitting diode comprises a semiconductor layer comprising gallium nitride having a second lattice constant and a third lattice constant, and the third lattice constant is greater than the second lattice constant. A ratio of the second lattice constant to the first lattice constant is greater than or equal to 0.56 and is less than or equal to 0.68.

In another embodiment, the display device of the disclosure includes a substrate, a first transistor, a second transistor and a blue light emitting diode. The first transistor is disposed on the substrate, wherein the first transistor comprises a first semiconductor layer comprising silicon. The second transistor is disposed on the substrate, wherein the second transistor comprises a second semiconductor layer comprising gallium and oxygen. A blue light emitting diode disposed on the substrate and electrically connected to the first transistor and the second transistor, wherein the blue light emitting diode comprises a semiconductor layer comprising gallium nitride. A ratio of an atomic percentage of gallium comprised in the second semiconductor layer of the second transistor to an atomic percentage of gallium comprised in the semiconductor layer of the blue light emitting diode is greater than or equal to 0.26 and is less than or equal to 0.55.

In order to make the aforementioned and other objectives and advantages of the present disclosure comprehensible, embodiments accompanied with figures are described in detail below.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
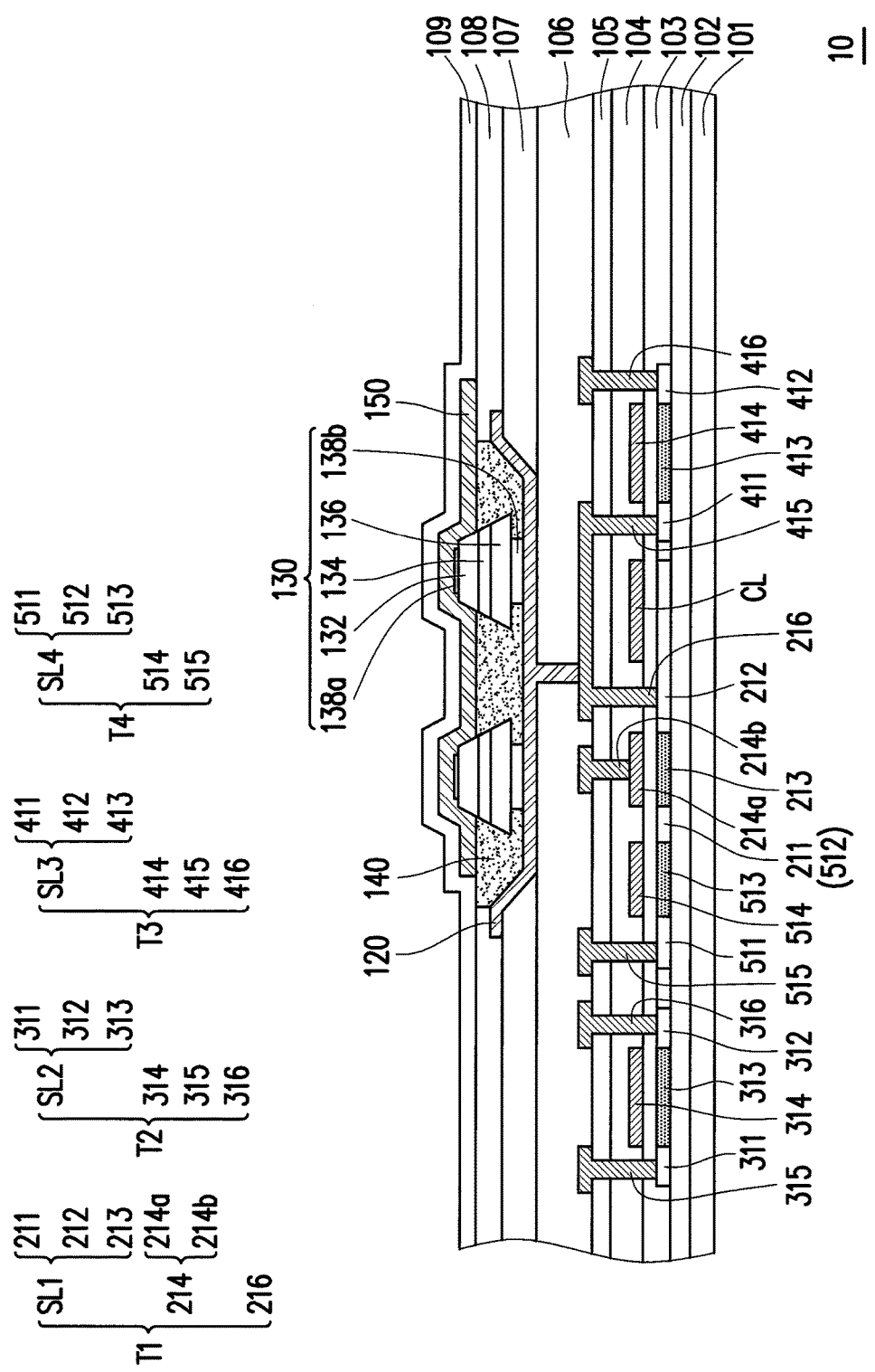
FIG. 1 is a schematic cross-sectional view of a part of a display device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

In the disclosure, the description of forming another structure above or on a structure may include an embodiment of forming direct contact between the structure and the another structure, and may also include an embodiment of forming an additional structure between the structure and the another structure so that the structure may not get in direct contact with the another structure.

In the disclosure, the size of the light emitting diodes (LEDs) is minimized into a micrometer-level, such that the light emitting diodes have a cross-sectional area of 300 µm×300 µm, 30 µm×301 µm, or 10 µm×10 µm. In an exemplary, the light emitting diodes have a cross-sectional of 10 µm×10 µm, and a driving current required for operating such light emitting diodes (e.g. micro-LEDs) is about $1 \times 10^{-5}$ A. In order to meet such driving current requirement, in the disclosure, a LTPS thin film transistor or a IGZO thin film transistor can be employed in a driving circuitry of the micro-LEDs. Furthermore, the light emitting diodes of the disclosure are designated for emitting a blue light which can be compatible with a conventional wavelength conversion material, such as a quantum dot material, as such the blue light emitted by the micro-LEDs may be easily converted into a red light, a green light, or a white light. Besides, in the disclosure, by controlling the lattice constants of the silicon comprised in the LTPS thin film transistor and gallium nitride comprised in the micro-LEDs, the light emitting efficiency of a display device is enhanced. Also, by controlling the ratio of gallium comprised in the IGZO thin film transistor to gallium comprised in the micro-LEDs, the light emitting efficiency of a display device is enhanced.

FIG. 1 is a schematic cross-sectional view of a part of a display device according to an embodiment of the disclosure. For clarification, FIG. 1 illustrates one sub-pixel unit, however, people having ordinary skills in the pertinent art should understand that a display device generally include an array including a plurality of sub-pixel units arranged in a specific manner based on the demand, where the number of the sub-pixel units is not specifically limited in the disclosure.

Referring to FIG. 1, a display device 10 includes a substrate 101, a transistor T1, a transistor T2, a transistor T3, a transistor T4, and light emitting diodes 130. The display device 10 further includes a buffer layer 102, a gate insulating layer 103, a plurality of insulating layers 104~109, a first electrode 120, a filling material 140, and a second electrode 150. A material of the substrate 101 may be, for example, a single layer or a stack of one of glass, quartz, organic polymers (e.g., polyimide, polyethylene terephthalate, polycarbonate, etc.), opaque/reflective materials (e.g., conductive materials, metals, wafers, ceramics, etc.) and other applicable materials, or a stack or a mixture of the at least two above-mentioned materials, but the disclosure is not limited thereto. As shown in FIG. 1, the buffer layer 102 is optionally disposed on the substrate 101. A material of the buffer layer 102 can includes, but not limited to, silicon oxide, silicon nitride, silicon oxynitride, or a stacked layer of the above materials.

Referring to FIG. 1, the transistor T1, the transistor T2, the transistor T3, and the transistor T4 are disposed on the substrate 101 and the buffer layer 102. The transistor T1 includes a semiconductor layer SL1, a gate electrode 214, and a source/drain electrode 216. In the embodiment, the gate electrode 214 is located on the semiconductor layer SL1. For example, as shown in FIG. 1, the gate electrode 214 can include a first portion 214a and a second portion 214b; in another example (not shown), the gate electrode 214 can include one of the first portion 214a and the second portion 214b, the disclosure is not limited thereto. In detail, the semiconductor layer SL1 includes a source/drain region 211, a source/drain region 212, and a channel region 213 located between the source/drain region 211 and the source/drain region 212. As shown in FIG. 1, the source/drain electrode 216 is connected to the source/drain region 212, the gate electrode 214 is overlapped with the channel region 213, and the source/drain region 211 of the transistor T1 is shared with the transistor T4.

In the embodiment, a material of the semiconductor layer SL is low temperature polysilicon, so that the transistor T1 is a low temperature polysilicon thin film transistor. In the embodiment, the semiconductor layer SL is in a poly-crystal phase, and a crystal ratio of the semiconductor layer SL1 is greater than 50%, such that the stability of the transistor T1 is enhanced, and the transistor T1 has a better performance. Experiments were performed to show the performances of the transistors included a semiconductor layer having different crystal ratios. The experiment results are shown in Table 1 below. It can be known from Table 1 that, when the semiconductor layer has a higher crystal ratio, a smaller threshold voltage shift can be obtained, and thus the transistor having such semiconductor layer can achieve better stability.

TABLE 1

| Experiment # | 1 | 2 | 3 | 4 |
|---|---|---|---|---|
| Annealing Time[1] | 15 mins | 30 mins | 45 mins | 60 mins |
| Crystal size | 8 nm | 12 nm | 20 nm | 23 nm |
| Crystal ratio | 40% | 50% | 60% | 73% |
| Mobility | 30 | 40 | 70 | 100 |
| Current | $2 \times 10^{-5}$ A | $3 \times 10^{-5}$ A | $5 \times 10^{-5}$ A | $1 \times 10^{-4}$ A |
| Threshold Voltage Shift[2] | 2 V | 1.2 V | 0.3 V | 0.15 V |

[1]Annealing temperature is 550° C.
[2]The threshold voltage shift was measured at a temperature of 60° C., when the voltage applied on the gate electrode was 20 V, the voltage applied on the source electrode was 0 V, and the voltage applied on the drain electrode was 15 V for the applied time of 3600 seconds.

Figure 4:
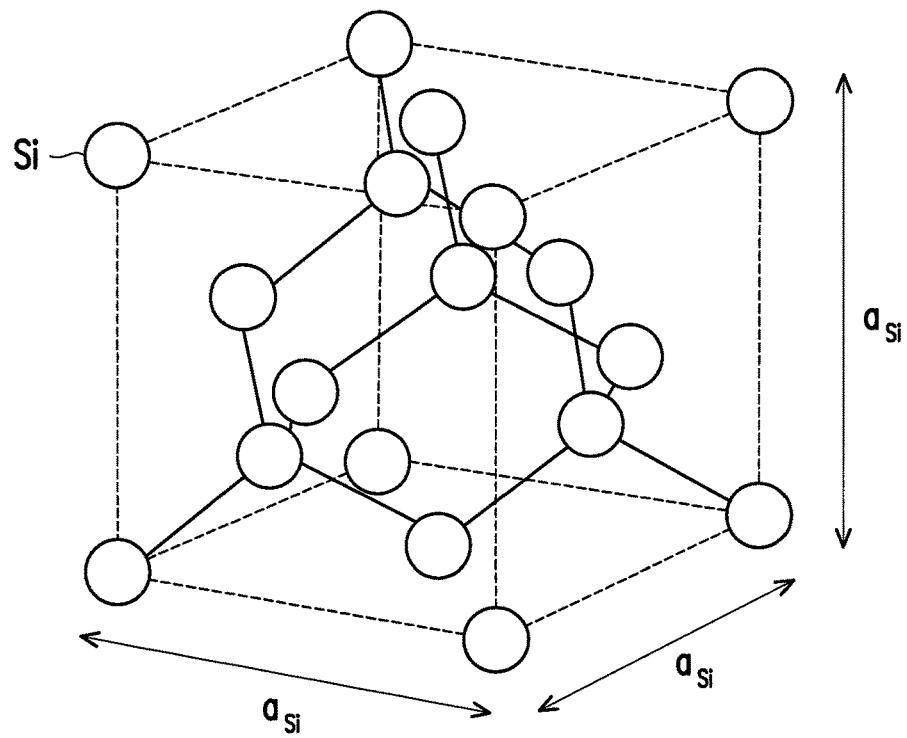
FIG. 4 is a schematic view of a crystal structure of silicon.

Furthermore, the silicon included in the semiconductor layer SL1 has a FCC crystal structure (i.e., a diamond crystal structure, see FIG. 4), wherein the FCC crystal structure of silicon included in the semiconductor layer SL1 has a lattice constant $a_{si}$ ranging from 5.20 Å to 5.50 Å (determined by transmission electron microscope-selected area diffraction pattern (TEM-SADP)), and preferably ranging from 5.30 Å to 5.45 Å. Since the lattice constant $a_{si}$ of silicon included in the semiconductor layer SL1 is less than 5.50 Å, a better electrical performance of the display device 10 is obtained. In consideration of electrical conductivity, the gate electrode 214 is often made of metal materials. However, the disclosure is not limited thereto. In other embodiments of the disclosure, the gate electrode 214 can also be made of other conductive materials. The metal material may include, for example, conductive materials (such as an alloy, a metal nitride material, a metal oxide material, a metal oxynitride material, or other suitable materials), or a stacked layer containing the metallic material and any other conductive material.

The transistor T2 includes a semiconductor layer SL2, a gate electrode 314, a source/drain electrode 315 and a source/drain electrode 316. In the embodiment, the gate electrode 314 is located on the semiconductor layer SL2. In detail, the semiconductor layer SL2 includes a source/drain region 311, a source/drain region 312, and a channel region 313 located between the source/drain region 311 and the source/drain region 312. The source/drain electrode 315 connects to the source/drain region 311, the source/drain electrode 316 connects to the source/drain region 312, and the gate electrode 314 is overlapped with the channel region 313. In the embodiment, a material of the semiconductor layer SL2 is the same as that of the semiconductor layer SL1, so that the transistor T2 is a low temperature polysilicon thin film transistor, and the semiconductor layer SL2 share the same properties and requirements of the semiconductor layer SL1 as described above. In other embodiments, the material of the semiconductor layer SL2 is, for example, different from that of the semiconductor layer SL. In some embodiments, a material of the gate electrode 314 is the same or different from that of the gate electrode 214, for example.

The transistor T3 includes a semiconductor layer SL3, a gate electrode 414, a source/drain electrode 415 and a source/drain electrode 416. In the embodiment, the gate electrode 414 is located on the semiconductor layer SL3. In detail, the semiconductor layer SL3 includes a source/drain region 411, a source/drain region 412, and a channel region 413 located between the source/drain region 411 and the source/drain region 412. The source/drain electrode 415 connects to the source/drain region 411, the source/drain electrode 416 connects to the source/drain region 412, and the gate electrode 414 is overlapped with the channel region 413. In the embodiment, a material of the semiconductor layer SL3 is the same as the material of the semiconductor layer SL1, so that the transistor T3 is a low temperature polysilicon thin film transistor, and the semiconductor layer SL3 share the same properties and requirements of the semiconductor layer SL1 as described above. In other embodiments, the material of the semiconductor layer SL3 is, for example, different from that of the semiconductor layer SL1. In some embodiments, a material of the gate electrode 414 is the same or different from the materials of the gate electrode 214 and the gate electrode 314, for example.

The transistor T4 includes a semiconductor layer SL4, a gate electrode 514, and a source/drain electrode 515. In the embodiment, the gate electrode 514 is located on the semiconductor layer SL4. In detail, the semiconductor layer SL4 includes a source/drain region 511, a source/drain region 512, and a channel region 513 located between the source/drain region 511 and the source/drain region 512. As shown in FIG. 1, the source/drain electrode 515 is connected to the source/drain region 511, the gate electrode 514 is overlapped with the channel region 513, and the source/drain region 512 of the transistor T4 is shared with the transistor T1. In other words, one source/drain region is shared by the transistor T1 and the transistor T4, where the source/drain region 512 of the transistor T4 is also referred as the source/drain region 211 of the transistor T1. In the embodiment, a material of the semiconductor layer SL4 is the same as the materials of the semiconductor layer SL1, so that the transistor T4 is a low temperature polysilicon thin film transistor, and the semiconductor layer SL4 share the same properties and requirements of the semiconductor layer SL1 as described above. In other embodiments, the material of the semiconductor layer SL4 is, for example, different from the materials of the semiconductor layer SL1. In some embodiments, a material of the gate electrode 414 is the same or different from the materials of the gate electrode 214, the gate electrode 314, and the gate electrode 414, for example.

Referring to FIG. 1, the transistor T1 and the transistor T4 share one source/drain region, e.g. the source/drain region 211 (also referred as the source/drain region 512). The source/drain electrode 415 of the transistor T3 is physically connected with the source/drain electrode 216 of the transistor T1. The source/drain electrode 316 of the transistor T2 is electrically connected to the gate electrode 214 of the transistor T1.

Referring to FIG. 1, the gate insulating layer 103 is disposed between the semiconductor layer SL and the gate electrode 214, between the semiconductor layer SL2 and the gate electrode 314, between the semiconductor layer SL3 and the gate electrode 414 and between the semiconductor layer SL4 and the gate electrode 514. In other embodiments, the gate insulating layer 103 may be conformally formed on and covers the semiconductor layer SL1, the semiconductor layer SL2, the semiconductor layer SL3 and the semiconductor layer SL4, for example. A material of the gate insulating layer 103 can include an inorganic material (such as silicon oxide, silicon nitride, or silicon oxynitride), an organic material (such as polyimide resin, epoxy resin, or acrylic resin), or a stacked layer containing the insulating material and any other insulating material.

In the embodiment, the insulating layer 104 and the insulating layer 105 are disposed on the gate electrode 214, the gate electrode 314, the gate electrode 414 and the gate electrode 514, wherein the insulating layer 105 is located on the insulating layer 104. In detail, the insulating layer 104 and the insulating layer 105 can both be used for protecting the gate electrode 214, the gate electrode 314, the gate electrode 414 and the gate electrode 514 from being damaged during the manufacturing process. The insulating layer 105 can be further served as a passivation layer for providing a flattening function. The materials of the insulating layer 104 and the insulating layer 105 can include an inorganic material (such as silicon oxide, silicon nitride, or silicon oxynitride), an organic material (such as polyimide resin, epoxy resin, or acrylic resin), or a stacked layer containing the insulating material and any other insulating material.

Referring to FIG. 1, the source/drain electrode 216 of the transistor T1, the source/drain electrode 315 and the source/drain electrode 316 of the transistor T2, the source/drain electrode 415 and the source/drain electrode 416 of the transistor T3, and the source/drain electrode 515 of the transistor T4 are disposed on the first portion 214a of the gate electrode 214, the gate electrode 314, the gate electrode 414 and the gate electrode 514, respectively. The source/drain electrode 216 of the transistor T1 is electrically connected to the source/drain region 212 through a first via hole formed in the insulating layer 104 and the insulating layer 105. As such, as shown in FIG. 1, the transistor T1 includes at least the semiconductor layer SL1 (including the source/drain region 211, the source/drain region 212 and the channel region 213), the gate electrode 214 (including the first portion 214a and the second portion 214b), and the source/drain electrode 216. The source/drain electrode 315 of the transistor T2 is electrically connected to the source/drain region 311 through a second via hole formed in the insulating layer 104 and the insulating layer 105; and similarly, the source/drain electrode 316 of the transistor T2 is electrically connected to the source/drain region 312 through a third via hole formed in the insulating layer 104 and the insulating layer 105. As such, as shown in FIG. 1, the transistor T2 includes at least the semiconductor layer SL2 (including the source/drain region 311, the source/drain region 312 and the channel region 313), the gate electrode 314, the source/drain electrode 315, and the source/drain electrode 316. The source/drain electrode 415 of the transistor T3 is electrically connected to the source/drain region 411 through a fourth via hole formed in the insulating layer 104 and the insulating layer 105; and similarly, the source/drain electrode 416 of the transistor T3 is electrically connected to the source/drain region 412 through a fifth via hole formed in the insulating layer 104 and the insulating layer 105. As such, as shown in FIG. 1, the transistor T3 includes at least the semiconductor layer SL3 (including the source/drain region 411, the source/drain region 412 and the channel region 413), the gate electrode 414, the source/drain electrode 415, and the source/drain electrode 416. The source/drain electrode 515 of the transistor T4 is electrically connected to the source/drain region 511 through a sixth via hole formed in the insulating layer 104 and the insulating layer 105. As such, as shown in FIG. 1, the transistor T4 includes at least the semiconductor layer SL4 (including the source/drain region 511, the source/drain region 512 and the channel region 513), the gate electrode 514, and the source/drain electrode 515. The materials of the source/drain electrode 216 of the transistor T1, the source/drain electrode 315 and the source/drain electrode 316 of the transistor T2, the source/drain electrode 415 and the source/drain electrode 416 of the transistor T3, and the source/drain electrode 515 of the transistor T4 can include metal materials, such as aluminium, molybdenum, titanium, gold indium, tin or a combination thereof.

In the embodiments, as shown in FIG. 1, the semiconductor layer SL1, the semiconductor layer SL2, the semiconductor layer SL3, and the semiconductor layer SL4 are formed in the same layer. The first portion 214a of the gate electrode 214 of the transistor T1, the gate electrode 314 of the transistor T2, the gate electrode 414 of the transistor T3, and the gate electrode 514 of the transistor T4 are formed in the same layer. The second portion 214b of the gate electrode 214 and the source/drain electrode 216 of the transistor T1, the source/drain electrode 315 and the source/drain electrode 316 of the transistor T2, the source/drain electrode 415 and the source/drain electrode 416 of the transistor T3, and the source/drain electrode 515 of the transistor T4 are formed in the same layer. However, the disclosure is not limited thereto.

As shown in FIG. 1, the display device 10 may further include a capacitor line CL. In one embodiment, the capacitor line CL may be disposed between the transistor T1 and the transistor T3, wherein the capacitor line CL, the first portion 214a of the gate electrode 214 of the transistor T1, the gate electrode 314 of the transistor T2, the gate electrode 414 of the transistor T3, and the gate electrode 514 of the transistor T4 are formed in the same layer. Here, as shown in FIG. 1, the capacitor line CL is coupled to the source/drain electrode 216 of the transistor T1 and the source/drain electrode 415 of the transistor T3 to form a storage capacitor (not marked), and the first electrode 120 is also coupled to the source/drain electrode 216 of the transistor T1 and the source/drain electrode 415 of the transistor T3 to form another storage capacitor (not marked).

Referring to FIG. 1, the insulating layer 106 and the insulating layer 107 are disposed on the transistor T1, the transistor T2, the transistor T3 and the transistor T4, wherein the insulating layer 107 is located on the insulating layer 106. In detail, the insulating layer 107 and the insulating layer 106 can be both used for protecting the transistor T1, the transistor T2, the transistor T3 and the transistor T4 from being damaged during the manufacturing process, wherein the insulating layer 107 can be further served as a passivation layer for providing a flattening function. The materials of the insulating layer 106 and the insulating layer 107 can include an inorganic material (such as silicon oxide, silicon nitride, or silicon oxynitride), an organic material (such as polyimide resin, epoxy resin, or acrylic resin), or a stacked layer containing the insulating material and any other insulating material.

Referring to FIG. 1, the first electrode 120 is disposed on the transistor T1, the transistor T2, the transistor T3 and the transistor T4, and the first electrode 120 is electrically connected to the transistor T1 and the transistor T4. In the embodiment, the first electrode 120 is electrically connected to the source/drain electrode 216 of the transistor T1 through a contact window formed in the insulating layer 106 and the insulating layer 107. In detail, a contact hole formed in the insulating layer 106 exposes the source/drain electrode 216 of the transistor T1, and an opening formed in the insulating layer 107 connects to the contact hole formed in the insulating layer 106, as such the contact hole formed in the insulating layer 106 and the opening formed in the insulating layer 107 together constitute the contact window exposing a part of the source/drain electrode 216 of the transistor T1. The first electrode 120 fills the contact hole and covers a bottom surface and sidewalls of the opening, and the first electrode 120 extends to a surface of the insulating layer 107 opposite to the transistor T1, the transistor T2, the transistor T3, and the transistor T4. In the embodiment, the first electrode 120 is served as a pixel electrode. A material of the first electrode 120 can include metal materials, such as aluminium, molybdenum, titanium, gold indium, tin or a combination thereof. A material of the first electrode 120 can be the same or different from the materials of the second portion 214b of the gate electrode 214, the source/drain electrode 216 of the transistor T1, the source/drain electrode 315 and the source/drain electrode 316 of the transistor T2, the source/drain electrode 415 and the source/drain electrode 416 of the transistor T3, and the source/drain electrode 515 of the transistor T4, the disclosure is not limited thereto. In some embodiments, the transistor T1, the transistor T2, the transistor T3, and the transistor T4, for example, may be formed with the same or different materials and processes, the disclosure is not limited thereto.

The insulating layer 108 is disposed on the insulating layer 107 and a portion of the first electrode 120, as shown in FIG. 1. In other words, a portion of the first electrode 120 can be exposed by the insulating layer 108. A material of the insulation layer 108, for example, may be an inorganic material, an organic material, or a combination thereof where the inorganic material, for example, is silicon oxide, silicon nitride, silicon oxynitride, or a stack layer of the foregoing at least two materials; the organic material, for example, is a macromolecular material, such as polyimide resin, epoxy resin, or acrylic resin. In the embodiment, the first electrode 120 and the insulating layer 108 together define an accommodated space for the light emitting diodes 130. In other words, the location of the accommodated space corresponds to the location of the first electrode 120.

Referring to FIG. 1, the light emitting diodes 130 are disposed on the transistor T1, the transistor T2, the transistor T3 and the transistor T4, and the light emitting diodes 130 are electrically connected to the transistor T1 and the transistor T4 through the first electrode 120. Each light emitting diode 130 includes a semiconductor layer of first conductivity type 132, an active layer 134, a semiconductor layer of second conductivity type 136, an electrode 138a, and an electrode 138b. In detail, the light emitting diodes 130 are disposed in the accommodated space formed by the first electrode 120 and the insulating layer 108, and each light emitting diode 130 is electrically connected to the first electrode 120 via the electrode 138b. For illustrative purposes, in an exemplary, a detailed structure of the light emitting diodes 130 will be elaborated in following descriptions.

Figure 3:
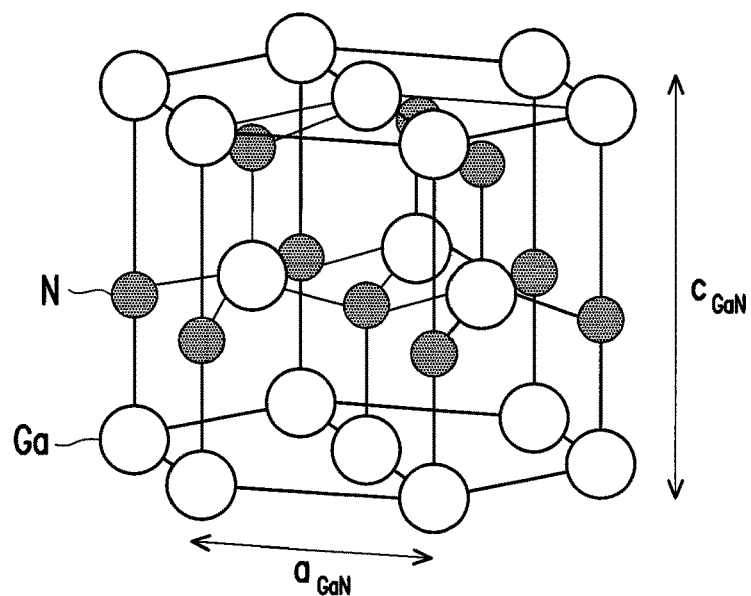
FIG. 3 is a schematic view of a crystal structure of gallium nitride.

In the embodiment, the light emitting diodes 130 are LEDs with micrometer-level sizes (e.g. micro-LEDs). In the embodiment, the light emitting diodes 130 are blue light emitting diodes, such as a gallium nitride (GaN) based light emitting diode, wherein a crystal structure of GaN has a hexagonal wurtzite structure with a lattice constant $a_{GaN}$ and a lattice constant $c_{GaN}$ (see FIG. 3), the semiconductor layer of the first conductivity type 132 includes a p-type GaN (e.g., Mg doped GaN), the active layer 134 includes a multiple quantum well structure layer of InGaN and GaN, the semiconductor layer of the second conductivity type 136 includes a n-type GaN (e.g., Si doped GaN), the electrode 138a may be a p-type electrode, and the electrode 138b may be n-type electrode. However, the disclosure is not limited thereto. In another embodiment, the semiconductor layer of the first conductivity type 132 may be a n-type GaN, the active layer 134 may be a quantum well structure layer of InGaN and GaN, the semiconductor layer of the second conductivity type 136 may be a p-type GaN, the electrode 138a may be a n-type electrode, and the electrode 138b may be p-type electrode. In the embodiment, the multiple quantum well structure layer of the active layer 134 is formed by laminating at least a pair of quantum well layers, wherein the pair of the quantum well layer includes a quantum well layer is formed of GaN and a quantum well layer is formed of $In_xGa_{1-x}N$ where x is about 0.26, to ensure that the light emitted from the light emitting diodes 130 is a blue light having a wavelength of 440 nm.

In the disclosure, the lattice constant $c_{GaN}$ of the gallium nitride included in the blue light emitting diodes 130 is greater than the lattice constant $a_{GaN}$ of the gallium nitride included in the blue light emitting diodes 130, wherein the lattice constant $a_{GaN}$ ranges from 3.10 Å to 3.50 Å (determined by TEM-SADP), and preferably ranges from 3.12 Å to 3.2 Å, and the lattice constant $c_{GaN}$ of the gallium nitride included in the blue light emitting diodes 130 ranges from 5.10 Å to 5.70 Å (determined by TEM-SADP), and preferably ranges from 5.15 Å to 5.21 Å. Particularly, a ratio of the lattice constant $a_{GaN}$ to the lattice constant $a_{Si}$ is greater than or equal to 0.56 and is less than or equal to 0.68, and preferably is greater than or equal to 0.57 and is less than or equal to 0.61, such that the light emitting diodes 130 are capable of emitting a blue light, thereby enhancing the light emitting efficiency. Also, a ratio of the lattice constant $c_{GaN}$ to the lattice constant $a_{Si}$ is greater than or equal to 0.92 and is less than or equal to 1.10, and preferably is greater than or equal to 0.94 and is less than or equal to 0.99. However, as the ratio of the lattice constant $a_{GaN}$ to the lattice constant $a_{Si}$ is less than 0.56 or the ratio of the lattice constant $c_{GaN}$ to the lattice constant $a_{Si}$ is greater than 1.10, the light emitting diodes 130 emit a red light; and as the ratio of the lattice constant $a_{GaN}$ to the lattice constant $a_{Si}$ is greater than 0.68 or the ratio of the lattice constant $c_{GaN}$ to the lattice constant $a_{Si}$ is less than 0.92, the light emitting diodes 130 emit a UV light.

In the disclosure, an atomic percentage of silicon comprised in the semiconductor layer SL1 of the transistor T1 is greater than at least one of an atomic percentage of gallium comprised in the semiconductor layer of the first conductivity type 132, an atomic percentage of gallium comprised in the active layer 134, and an atomic percentage of gallium comprised in the semiconductor layer of the second conductivity type 136 of the light emitting diodes 130. In some embodiments, the relationship between the transistor T1 and the light emitting diodes 130 may also be used in forming the transistor T2, the transistor T3, and/or the transistor T4, the disclosure is not limited thereto. As shown in FIG. 1, the light emitting diodes 130 are vertical LEDs; however, the disclosure is not limited thereto. In other embodiments, the light emitting diodes 130 may be flip chip LEDs (not shown), and people having ordinary skills in the pertinent art should understand that the flip chip LEDs can have the same or like properties of the vertical LEDs in FIG. 1.

On the other hand, for the consideration of the driving circuitry in the display device 10, the transistor T1 electrically connected to the light emitting diodes 130 can be served as a driving transistor, the transistor T2 electrically connected to a scan line (not shown) and a data line (not shown) can be served as a signal receiving transistor, the transistor T3 electrically connected to a reset voltage (not shown) can be served as a signal reset transistor, and the transistor T4 electrically connected to a power supply voltage (not shown) can be served as a light emission control transistor.

Referring to FIG. 1, the filling material 140 fills the accommodated space and covers at least the side surfaces of the light emitting diodes 130. A material of the filling material 140 may, for example, include glue, resin, silicon oxide, silicon nitride or underfiller. In additional, the material of the filling material 140 may further include, but not limited to, a quantum dot material, a fluorescent powder material, a phosphor power material, or a combination thereof. In other embodiments, the filling material 140 may completely encapsulate the light emitting diodes 130.

Referring to FIG. 1, the second electrode 150 is disposed on the light emitting diodes 130, the filling material 140, and the insulating layer 108. In the embodiment, the second electrode 150 is conformally formed on the light emitting diodes 130, the filling material 140, and the insulating layer 108. The second electrode 150 can receive a common voltage from an element (e.g., a transistor or a terminal pad electrically grounded) of a driving circuitry located outside the sub-pixel unit, the driving circuitry may be designated and selected based on the demand by persons skilled in the art and is not specifically limited in the disclosure, and thus are omitted from illustration herein. A material of the second electrode 150 can include metal materials, such as aluminium, molybdenum, titanium, gold indium, tin or a combination thereof. The materials of the second electrode 150 can be the same or different from the materials of the second portion 214b of the gate electrode 214 and the source/drain electrode 216 of the transistor T1, the source/drain electrode 315 and the source/drain electrode 316 of the transistor T2, the source/drain electrode 415 and the source/drain electrode 416 of the transistor T3, the source/drain electrode 515 and the source/drain electrode 516 of the transistor T4, and the first electrode 120; the disclosure is not limited thereto.

The insulating layer 109 is disposed on the substrate 101. As shown in FIG. 1, the insulating layer 109 is conformally formed on the insulating layer 108 and the second electrode 150. The insulating layer 109 can be served as a protection layer which can protect the light emitting diodes 130 and the second electrode 150 from being damaged during the manufacturing process. A material of the insulating layer 109, for example, may be an inorganic material, an organic material, or a combination thereof, where the inorganic material, for example, is silicon oxide, silicon nitride, silicon oxynitride, or a stack layer of the foregoing at least two materials; the organic material, for example, is a macromolecular material, such as polyimide resin, epoxy resin, or acrylic resin.

On the other hand, the materials of the buffer layer 102, the insulating layer 103, the insulating layer 104, the insulating layer 105, the insulating layer 106, the insulating layer 107, the insulating layer 108, and the insulating layer 109 can be the same or different from one another. The disclosure is not limited thereto.

Figure 2:
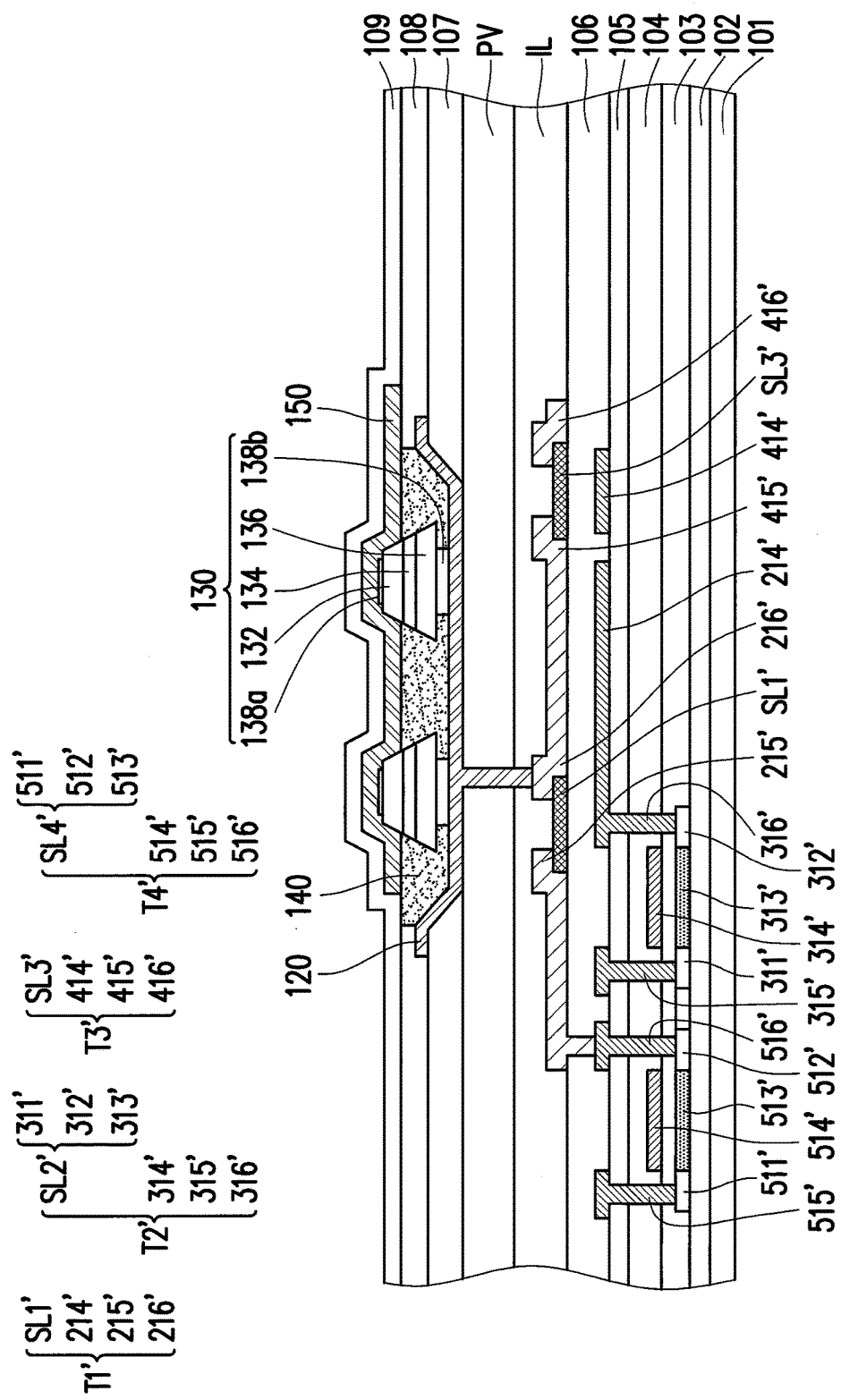
FIG. 2 is a schematic cross-sectional view of a part of a display device according to another embodiment of the disclosure.

FIG. 2 is a schematic cross-sectional view of a part of a display device according to another embodiment of the disclosure. For clarification, FIG. 2 illustrates one sub-pixel unit, however, people having ordinary skills in the pertinent art should understand that a display device generally include an array including a plurality of sub-pixel units arranged in a specific manner based on the demand, where the number of the sub-pixel units is not specifically limited in the disclosure.

Referring to FIG. 2, a display device 20 includes a substrate 101, a transistor T1', a transistor T2', a transistor T3', a transistor T4', and light emitting diodes 130. The display device 20 further includes a buffer layer 102, a gate insulating layer 103, a plurality of insulating layers 104~109, IL, PV, a first electrode 120, a filling material 140, and a second electrode 150 The materials of the substrate 101, the buffer layer 102, the gate insulating layer 103, the plurality of insulating layers 104~109, the first electrode 120, the filling material 140, and the second electrode 150 depicted in FIG. 2, for example, may be the same as or similar to the materials of the substrate 101, the buffer layer 102, the gate insulating layer 103, the plurality of insulating layers 104~109, the first electrode 120, the filling material 140, and the second electrode 150 depicted in FIG. 1, respectively; and therefore will not be further elaborated with details hereinafter. As shown in FIG. 2, the buffer layer 102 is optionally disposed on the substrate 101.

Referring to FIG. 2, the transistor T1', the transistor T2', the transistor T3' and the transistor T4' are disposed on the substrate 101 and the buffer layer 102, and the detailed structure of the light emitting diodes 130 will be elaborated in following descriptions.

The transistor T4' includes a semiconductor layer SL4', a gate electrode 514', a source/drain electrode 515' and a source/drain electrode 516'. In the embodiment, the gate electrode 514' is located on the semiconductor layer SL4'. In detail, the semiconductor layer SL4' includes a source/drain region 511', a source/drain region 512', and a channel region 513' located between the source/drain region 511' and the source/drain region 512'. As shown in FIG. 2, the source/drain electrode 515' connects to the source/drain region 511', the source/drain electrode 516' connects to the source/drain region 512', and the gate electrode 514' is overlapped with the channel region 513'. In the embodiment, a material of the semiconductor layer SL4' is low temperature polysilicon, so that the transistor T4' is a low temperature polysilicon thin film transistor. In the embodiment, the semiconductor layer SL4' is in a poly-crystal phase, and a crystal ratio of the semiconductor layer SL4' is greater than 50%. The silicon included in the semiconductor layer SL4' has a FCC crystal structure (i.e., a diamond crystal structure, see FIG. 4), wherein the FCC crystal structure of silicon included in the semiconductor layer SL4' has a lattice constant $a_{si}$ ranging from 5.20 Å to 5.50 Å (determined by TEM-SADP), and preferably ranging from 5.30 Å to 5.45 Å. Since the lattice constant $a_{si}$ of silicon included in the semiconductor layer SL4' is less than 5.50 Å, a better electrical performance of the display device 20 is obtained.

The transistor T2' includes a semiconductor layer SL2', a gate electrode 314', a source/drain electrode 315' and a source/drain electrode 316'. In the embodiment, the gate electrode 314' is located on the semiconductor layer SL2'. In detail, the semiconductor layer SL2' includes a source/drain region 311', a source/drain region 312', and a channel region 313' located between the source/drain region 311' and the source/drain region 312'. As shown in FIG. 2, the source/drain electrode 315' connects to the source/drain region 311', the source/drain electrode 316' connects to the source/drain region 312', and the gate electrode 314' is overlapped with the channel region 313'. In the embodiment, a material of the semiconductor layer SL2' is the same as that of the semiconductor layer SL4', so that the transistor T2' is a low temperature polysilicon thin film transistor, and the semiconductor layer SL2' share the same properties and requirements of the semiconductor layer SL4' as described above. In other embodiments, the material of the semiconductor layer SL2' is, for example, different from that of the semiconductor layer SL4'. In some embodiments, a material of the gate electrode 314' is the same or different from that of the gate electrode 514', for example.

Referring to FIG. 2, the gate insulating layer 103 is disposed between the semiconductor layer SL4' and the gate electrode 514' and between the semiconductor layer SL2' and the gate electrode 314'. In other embodiments, the gate insulating layer 103 can be conformally formed on and covers the semiconductor layer SL4' and the semiconductor layer SL2'.

In the embodiment, the insulating layer 104 and the insulating layer 105 are disposed on the gate electrode 514' and the gate electrode 314', wherein the insulating layer 105 is located on the insulating layer 104. In detail, the insulating layer 104 and the insulating layer 105 can be both used for protecting the gate electrode 514' and the gate electrode 314' from being damaged during the manufacturing process, wherein the insulating layer 105 can be further served as a passivation layer for provide a flattening function.

Referring to FIG. 2, the source/drain electrode 515' and the source/drain electrode 516' of the transistor T4', the source/drain electrode 315' and the source/drain electrode 316' of the transistor T2' are disposed on the gate electrode 514' and the gate electrode 314', respectively. The source/drain electrode 515' of the transistor T4' is electrically connected to the source/drain region 511' through a first through hole formed in the insulating layer 104 and the insulating layer 105; and similarly, the source/drain electrode 516' of the transistor T4' is electrically connected to the source/drain region 512' through a second through hole formed in the insulating layer 104 and the insulating layer 105. As such, the transistor T4' includes at least the semiconductor layer SL4' (including the source/drain region 511', the source/drain region 512' and the channel region 513'), the gate electrode 514', the source/drain electrode 515', and the source/drain electrode 516'. The source/drain electrode 315' of the transistor T2' is electrically connected to the source/drain region 311' through a third through hole formed in the insulating layer 104 and the insulating layer 105; and similarly, the source/drain electrode 316' of the transistor T2' is electrically connected to the source/drain region 312' through a fourth through hole formed in the insulating layer 104 and the insulating layer 105. As such, the transistor T2' includes at least the semiconductor layer SL2', the gate electrode 314', the source/drain electrode 315', and the source/drain electrode 316'. In some embodiments, the transistor 12' and the transistor T4', for example, may be formed with the same materials and processes, and thus the transistor T2' and the transistor T4' can share the same properties, such as the lattice constants and the crystal ratio, however the disclosure is not limited thereto. In some embodiments, the transistor T2' and the transistor T4', for example, may be formed with the different materials and processes.

Referring to FIG. 2, the transistor T1', the transistor T3' are disposed on the transistor T2' and the transistor T4'.

The transistor T3' includes a semiconductor layer SL3', a gate electrode 414', a source/drain electrode 415' and a source/drain electrode 416'. In the embodiment, the gate electrode 414' is located on the insulating layer 104 and the insulating layer 105, and the semiconductor layer SL3', the source/drain electrode 415' and the source/drain electrode 416' are located on the gate electrode 414'. The semiconductor layer SL3' can be made of indium gallium zinc oxide (IGZO). In detail, the semiconductor layer SL3' includes $In_wGa_xZn_yO_z$, where w is 1, x ranges from 1.47 to 1.60, y ranges from 1.07 to 1.24, and z ranges from 4.38 to 4.77, and the semiconductor layer SL3' is an amorphous phase or a micro-crystal phase, wherein a crystal ratio of the semiconductor layer SL3' is less than 50%, and a crystal size of the semiconductor layer SL3' is less than 1 nm. In the disclosure, an atomic percentage of gallium comprised in the semiconductor layer SL3' of the transistor T3' is greater than or equal to 0.16 and is less than or equal to 0.20, and preferably is greater than or equal to 0.176 and is less than or equal to 0.194; and thereby enhancing the carrier mobility of the semiconductor layer SL3' and ensuring the reliability of the transistor T3'. Note that, as the atomic percentage of gallium comprised in the semiconductor layer SL3' of the transistor T3' is less than 0.16, the reliability of the transistor T3' is decreased; and as the atomic percentage of gallium comprised in the semiconductor layer SL3' of the transistor T3' is greater than 0.20, the carrier mobility of the semiconductor layer SL3' is decreased. In the embodiment, a material of the gate electrode 414' is the same as the source/drain electrode 515' and the source/drain electrode 516' of the transistor T4' and the source/drain electrode 315' and the source/drain electrode 316' of the transistor T2'. However, in one embodiment, the material of the gate electrode 414' is the same as the materials of the gate electrode 514' and the gate electrode 314'. In other embodiments, the material of the gate electrode 414' is, for example, different from the materials of the gate electrode 514' and the gate electrode 314'.

The transistor T1' includes a semiconductor layer SL1', a gate electrode 214', a source/drain electrode 215' and a source/drain electrode 216'. In the embodiment, the gate electrode 214' is located on the insulating layer 104 and the insulating layer 105, and the semiconductor layer SL1', the source/drain electrode 215' and the source/drain electrode 215' are located on the gate electrode 214'. A material of the semiconductor layer SL1' is the same as the materials of the semiconductor layer SL3', such that the semiconductor layer SL1' and the semiconductor layer SL3' share the same properties and requirements as described above. In the embodiment, a material of the gate electrode 214' is the same as the source/drain electrode 515' and the source/drain electrode 516' of the transistor T4' and the source/drain electrode 315' and the source/drain electrode 316' of the transistor T2'. As shown in FIG. 2, the source/drain electrode 316' of the transistor T2' is further employed as the gate electrode 214' of the transistor T1', thereby reducing a layout area of the sub-pixel unit. However, in one embodiment, the material of the gate electrode 214' is the same as the materials of the gate electrode 514' and the gate electrode 314'. In other embodiments, the material of the gate electrode 214' is, for example, different from the materials of the gate electrode 514' and the gate electrode 314'.

In the embodiment, the insulating layer 106 is disposed on the transistor T2', the transistor T4', the gate electrode 214' of the transistor T1' and the gate electrode 414' of the transistor T3'. In detail, the insulating layer 106 can be used for protecting the transistor T2' and the transistor T4' from being damaged during the manufacturing process, and the insulating layer 106 can be served a gate insulation layer of the transistor T1' and the transistor T3'. As shown in FIG. 2, the source/drain electrode 316' of the transistor T2' (or saying the gate electrode 214' of the transistor T1') can be coupled to the source/drain electrode 216' of the transistor T1' and the source/drain electrode 416' of the transistor T3' to form a storage capacitor (not marked).

Referring to FIG. 2, the source/drain electrode 415' and the source/drain electrode 416' of the transistor T3' can be directly disposed on the semiconductor layer SL3', as such the transistor T3' includes at least the gate electrode 414' the semiconductor layer SL3', the source/drain electrode 415', and the source/drain electrode 416'. The source/drain electrode 215' and the source/drain electrode 216' of the transistor T1' can be directly disposed on the semiconductor layer SL1', as such the transistor T1' includes at least the gate electrode 214', the semiconductor layer SL1', the source/drain electrode 215', and the source/drain electrode 216'. In the embodiment, materials of the source/drain electrode 415' and the source/drain electrode 416' of the transistor T3' and the source/drain electrode 215' and the source/drain electrode 216' of the transistor T1' are the same, however the disclosure is not limited thereto. In other embodiments, materials of the source/drain electrode 415' and the source/drain electrode 416' of the transistor T3' and the source/drain electrode 215' and the source/drain electrode 216' of the transistor T1' can be different.

In the embodiment, the source/drain electrode 516' of the transistor T4' can be electrically connected to the source/drain electrode 215' of the transistor T1' through a fifth through hole formed in the insulating layer 106. The source/drain electrode 216' of the transistor T1' is electrically connected to the source/drain electrode 415' of the transistor T3'. The transistor T2' is electrically connected to the transistor T1' via and the source/drain electrode 316' and the gate electrode 214'.

In the embodiments, as shown in FIG. 2, the semiconductor layer SL2' and the semiconductor layer SL4' can be formed in the same layer, and the semiconductor layer SL1' and the semiconductor layer SL3' can be formed in the same layer. The gate electrode 514' of the transistor T4' and the gate electrode 314' of the transistor T2' can be formed in the same layer. The source/drain electrode 515' and the source/drain electrode 516' of the transistor T4', the source/drain electrode 315' and the source/drain electrode 316' of the transistor T2', the gate electrode 414' of the transistor T3' and the gate electrode 214' of the transistor T1' can be formed in the same layer, wherein the gate electrode 214' can be directly connects the source/drain electrode 316'. The source/drain electrode 415' and the source/drain electrode 416' of the transistor T3' and the source/drain electrode 215' and the source/drain electrode 216' of the transistor T1' can be formed in the same layer. However, the disclosure is not limited thereto. In some embodiments, the transistor T1' and the transistor T3', for example, may be formed with the same materials and processes, and thus the transistor T1' and the transistor T3' can share the same properties, however the disclosure is not limited thereto. In some embodiments, the transistor T1' and the transistor T3', for example, may be formed with the different materials and processes.

Referring to FIG. 2, the insulating layer IL, the insulating layer PV and the insulating layer 107 are disposed on the transistor T1', the transistor T2', the transistor T3' and the transistor T4', wherein the insulating layer PV and the insulating layer 107 are located on the insulating layer 106, and the insulating layer PV is located between the insulating layer IL and the insulating layer 107. In detail, the insulating layer IL, the insulating layer PV and the insulating layer 107 can be used for protecting the transistor T1', the transistor T2', the transistor T3' and the transistor T4' from being damaged during the manufacturing process, wherein the insulating layer PV and the insulating layer 107 can be served as a passivation layer for provide a flattening function. The materials of the insulating layer IL, the insulating layer PV and the insulating layer 107 can include an inorganic material (such as silicon oxide, silicon nitride, or silicon oxynitride), an organic material (such as polyimide resin, epoxy resin, or acrylic resin), or a stacked layer containing the insulating material and any other insulating material.

Referring to FIG. 2, the first electrode 120 is disposed on the transistor T1', the transistor T2', the transistor T3' and the transistor T4', and the first electrode 120 is electrically connected to the transistor T1' and the transistor T4'. In the embodiment, the first electrode 120 is electrically connected to the source/drain electrode 216' of the transistor T1' through a contact window formed in the insulating layer IL, the insulating layer PV and the insulating layer 107. In detail, a contact hole formed in the insulating layer IL and the insulating layer PV exposes the source/drain electrode 216' of the transistor T1', and an opening formed in the insulating layer 107 connects to the contact hole formed in the insulating layer IL and the insulating layer PV, as such the contact hole formed in the insulating layer IL and the insulating layer PV and the opening formed in the insulating layer 107 together constitute a contact window exposing a part of the source/drain electrode 216' of the transistor T1'. The first electrode 120 fills the contact hole and covers a bottom surface and sidewalls of the opening, and the first electrode 120 extends to a surface of the insulating layer 107 opposite to the transistor T1', the transistor T2', the transistor T3', and the transistor T4'. In the embodiment, the first electrode 120 can be served as a pixel electrode. Additionally, as shown in FIG. 2, the first electrode 120 is electrically connected to the transistor T3' via the source/drain electrode 216'.

The insulating layer 108 is disposed on the insulating layer 107 and a portion of the first electrode 120, as shown in FIG. 2. In other words, a portion of the first electrode 120 is exposed by the insulating layer 108. In the embodiment, the first electrode 120 and the insulating layer 108 together define an accommodated space for the light emitting diodes 130. In other words, the location of the accommodated space corresponds to the location of the first electrode 120.

Referring to FIG. 2, the light emitting diodes 130 are disposed on the transistor T1', the transistor T2', the transistor T3' and the transistor T4', and the light emitting diodes 130 are electrically connected to the transistor T1' and the transistor T4' through the first electrode 120. Each light emitting diode 130 includes a semiconductor layer of first conductivity type 132, an active layer 134, a semiconductor layer of second conductivity type 136, an electrode 138a, and an electrode 138b. In detail, the light emitting diodes 130 are disposed in the accommodated space formed by the first electrode 120 and the insulating layer 108, and each light emitting diode 130 is electrically connected to the first electrode 120 via the electrode 138b. For illustrative purposes, in an exemplary, the detailed structure of the light emitting diodes 130 will be elaborated in following descriptions.

In the embodiment, the light emitting diodes 130 are LEDs with micrometer-level sizes. In the embodiment, the light emitting diodes 130 are blue light emitting diodes, such as a gallium nitride (GaN) based light emitting diode, wherein a crystal structure of GaN has a hexagonal wurtzite structure with a lattice constant $a_{GaN}$ and a lattice constant $c_{GaN}$ (see FIG. 3), the semiconductor layer of the first conductivity type 132 includes a p-type GaN (e.g., Mg doped GaN), the active layer 134 includes a multiple quantum well structure layer of InGaN and GaN, the semiconductor layer of the second conductivity type 136 includes a n-type GaN (e.g., Si doped GaN), the electrode 138a may be a p-type electrode, and the electrode 138b may be n-type electrode. However, the disclosure is not limited thereto. In another embodiment, the semiconductor layer of the first conductivity type 132 may be a n-type GaN, the active layer 134 may be a quantum well structure layer of InGaN and GaN, the semiconductor layer of the second conductivity type 136 may be a p-type GaN, the electrode 138a may be a n-type electrode, and the electrode 138b may be p-type electrode. In the embodiment, the multiple quantum well structure layer of the active layer 134 is formed by laminating at least a pair of quantum well layers, wherein the pair of the quantum well layers includes a quantum well layer is formed of GaN and a quantum well layer is formed of $In_xGa_{1-x}N$ where x is about 0.26, to ensure that the light emitted from the light emitting diodes 130 is a blue light having a wavelength of 440 nm.

In the disclosure, at least one of an atomic percentage of gallium comprised in the semiconductor layer of the first conductivity type 132, an atomic percentage of gallium comprised in the active layer 134, and an atomic percentage of gallium comprised in the semiconductor layer of the second conductivity type 136 is greater than or equal to 0.4 and is less than or equal to 0.60, and preferably equal to 0.50, thereby reducing the dislocation defects of crystal structure in the light emitting diodes 130 and further enhancing the light emitting efficiency of the display device 20. Note that, as the atomic percentage of gallium comprised in the semiconductor layer of the first conductivity type 132, in the active layer 134, and in the semiconductor layer of the second conductivity type 136 of the light emitting diodes 130 is less than 0.40 or greater than 0.60, the dislocation defects are increased and light emitting efficiency is reduced. On the other hand, a ratio of an atomic percentage of gallium comprised in the semiconductor layer SL1' of the transistor T1' to at least one of an atomic percentage of gallium comprised in the semiconductor layer of the first conductivity type 132, an atomic percentage of gallium comprised in the active layer 134, and an atomic percentage of gallium comprised in the semiconductor layer of the second conductivity type 136 of the light emitting diodes 130 is greater than or equal to 0.26 and is less than or equal to 0.55, and preferably is greater than or equal to 0.26 and is less than or equal to 0.50, which is able to enhance the light emitting efficiency of the display device 20. In some embodiments, the relationship between the transistor T1' and the light emitting diodes 130 may also be used in forming the transistor T3', the disclosure is not limited thereto.

Additionally, as similar to the embodiment of FIG. 1, in the embodiment of FIG. 2, the lattice constant $c_{GaN}$ of the gallium nitride included in the blue light emitting diodes 130 is greater than the lattice constant $a_{GaN}$, wherein the lattice constant $a_{GaN}$ ranges from 3.10 Å to 3.50 Å, and preferably ranges from 3.12 Å to 3.2 Å, and the lattice constant $c_{GaN}$ of the gallium nitride included in the blue light emitting diodes 130 ranges from 5.10 Å to 5.70 Å, and preferably ranges from 5.15 Å to 5.21 Å. Particularly, the ratio of the lattice constant $a_{GaN}$ to the lattice constant $a_{Si}$ is greater than or equal to 0.56 and is less than or equal to 0.68, and preferably is greater than or equal to 0.57 and is less than or equal to 0.61, such that the light emitting diodes 130 emit a blue light, thereby enhancing the light emitting efficiency. Also, the ratio of the lattice constant $c_{GaN}$ to the lattice constant $a_{Si}$ is greater than or equal to 0.92 and is less than or equal to 1.10, and preferably is greater than or equal to 0.94 and is less than or equal to 0.99. In the disclosure, the atomic percentage of silicon comprised in the semiconductor layer SL4' of the transistor T4' is greater than at least one of an atomic percentage of gallium comprised in the semiconductor layer of the first conductivity type 132, an atomic percentage of gallium comprised in the active layer 134, and an atomic percentage of gallium comprised in the semiconductor layer of the second conductivity type 136 of the light emitting diodes 130. In some embodiments, the relationship between the transistor T4' and the light emitting diodes 130 may also be used in forming the transistor T2', the disclosure is not limited thereto. As shown in FIG. 2, the light emitting diodes 130 are vertical LEDs; however, the disclosure is not limited thereto. In other embodiments, the light emitting diodes 130 may be flip chip LEDs (not shown), and people having ordinary skills in the pertinent art should understand that the flip chip LEDs can have the same or like properties of the vertical LEDs in FIG. 2; and the detailed structure of the light emitting diodes 130 will be elaborated in following descriptions.

Furthermore, for the consideration of the driving circuitry in the display device 10, the transistor T1' electrically connected to the light emitting diodes 130 can be served as a driving transistor, the transistor T2' electrically connected to a scan line (not shown) and a data line (not shown) can be served as a signal receiving transistor, the transistor T3' electrically connected to a reset voltage (not shown) can be served as a signal reset transistor, and the transistor T4' electrically connected to a power supply voltage (not shown) can be served as a light emission control transistor.

Referring to FIG. 2, the filling material 140 can fill the accommodated space and cover at least the side surfaces of the light emitting diodes 130. A material of the filling material 140 may, for example, include glue, resin, silicon oxide, silicon nitride or underfiller. In additional, the material of the filling material 140 may further include, but not limited to, a quantum dot material, a fluorescent powder material, a phosphor power material, or a combination thereof. In other embodiments, the filling material 140 may completely encapsulate the light emitting diodes 130.

Referring to FIG. 2, the second electrode 150 is disposed on the light emitting diodes 130, the filling material 140, and the insulating layer 108. In the embodiment, the second electrode 150 is conformally formed on the light emitting diodes 130, the filling material 140, and the insulating layer 108. The second electrode 150 can receive a common voltage from an element (e.g., a transistor or a terminal pad electrically grounded) of a driving circuitry located outside the sub-pixel unit, the driving circuitry may be designated and selected based on the demand by persons skilled in the art and is not specifically limited in the disclosure, and thus are omitted from illustration herein.

As shown in FIG. 2, the insulating layer 109 can be disposed on the substrate 101. As shown in FIG. 2, the insulating layer 109 is conformally formed on the insulating layer 108 and the second electrode 150. The insulating layer 109 can protect the light emitting diodes 130 and the second electrode 150 from being damaged during the manufacturing process.

On the other hand, the materials of the buffer layer 102, the insulating layer 103, the insulating layer 104, the insulating layer 105, the insulating layer 106, the insulating layer IL, the passivation layer PV, the insulating layer 107, the insulating layer 108, and the insulating layer 109 can be the same or different from one another. The disclosure is not limited thereto.

Additionally, in some embodiments, the display device 10 depicted in FIG. 1 and display device 20 depicted in FIG. 2 may include an opposite substrate (not shown), wherein the opposite substrate may include a substrate having at least one of a color filter layer, a wavelength conversion layer, a black matrix layer, and other insulating layers, and the positioning configuration and materials of the above elements may be common known and may be designated and selected based on the demand by persons skilled in the art, and thus are omitted from illustration herein. Specifically, the wavelength conversion layer may include a quantum dot material, which can be employed to convert the blue light emitted by the light emitting diodes 130 into a red light or a green light. In other embodiment, the wavelength conversion layer may, for example, be disposed on the substrate 101 and is between the light emitting diodes 130, the filling material 140, and the first electrode 150. Only two light emitting diodes 130 are presented in FIG. 1 and FIG. 2 for illustrative purposes, but the number of the light emitting diodes 130 disposed on the first electrode 120 is not particularly limited to the embodiments and can be varied based on design requirements. In some embodiments, the number of the light emitting diodes 130 can be greater than two or less than two, for example.

Based on the above, in the display device of the disclosure, by controlling the lattice constants of the silicon comprised in the LTPS thin film transistor and gallium nitride comprised in at least one of the semiconductor layers and the active layer of the light emitting diodes, the light emitting efficiency of the display device having the blue LEDs is enhanced. On the other hand, by controlling the ratio of gallium comprised in the IGZO thin film transistor to gallium comprised in at least one of the semiconductor layers and the active layer of the light emitting diodes, the light emitting efficiency of the display device having the blue LEDs is also enhanced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. A display device, comprising:
   a substrate,
   a first transistor disposed on the substrate, wherein the first transistor comprises a first semiconductor layer comprising silicon having a first lattice constant, the first semiconductor layer is in a poly-crystal phase, and a crystal ratio of the first semiconductor layer is in a range from 50% to 73%;
   a light emitting diode disposed on the substrate and electrically connected to the first transistor, wherein the light emitting diode comprises a semiconductor layer comprising gallium nitride having a second lattice constant and a third lattice constant, and the third lattice constant is greater than the second lattice constant,
   wherein a ratio of the second lattice constant to the first lattice constant is greater than or equal to 0.56 and is less than or equal to 0.68; and
   an insulating layer sandwiched between the first transistor and the light emitting diode, wherein the first transistor is located between the insulating layer and the substrate, and the insulating layer covers the first transistor.

2. The display device according to claim 1, wherein the ratio of the second lattice constant to the first lattice constant is greater than or equal to 0.57 and is less than or equal to 0.61.

3. The display device according to claim 1, wherein an atomic percentage of silicon comprised in the first semiconductor layer of the first transistor is greater than an atomic percentage of gallium comprised in the semiconductor layer of the light emitting diode.

4. The display device according to claim 1, wherein the light emitting diode is a blue light emitting diode.

5. The display device according to claim 1, wherein a ratio of the third lattice constant to the first lattice constant is greater than or equal to 0.92 and is less than or equal to 1.10.

6. The display device according to claim 5, wherein the ratio of the third lattice constant to the first lattice constant is greater than or equal to 0.94 and is less than or equal to 0.99.

7. The display device according to claim 1, further comprising a second transistor disposed on the substrate, wherein the second transistor comprises a second semiconductor layer comprising gallium and oxygen.

8. The display device according to claim 7, wherein the second transistor is electrically connected to the light emitting diode.

9. The display device according to claim 7, wherein a ratio of an atomic percentage of gallium comprised in the second semiconductor layer of the second transistor to an atomic percentage of gallium comprised in the semiconductor layer of the light emitting diode is greater than or equal to 0.26 and is less than or equal to 0.55.

10. A display device, comprising:
    a substrate,
    a first transistor disposed on the substrate, wherein the first transistor comprises a first semiconductor layer comprising silicon;
    a second transistor disposed on the substrate, wherein the second transistor comprises a second semiconductor layer comprising gallium and oxygen, and a crystal ratio of the second semiconductor layer is less than 50%; and a blue light emitting diode disposed on the substrate and electrically connected to the first transistor and the second transistor, wherein the blue light emitting diode comprises a semiconductor layer comprising gallium nitride, wherein a ratio of an atomic percentage of gallium comprised in the second semiconductor layer of the second transistor to an atomic percentage of gallium comprised in the semiconductor layer of the blue light emitting diode is greater than or equal to 0.26 and is less than or equal to 0.55, wherein the atomic percentage of gallium comprised in the second semiconductor layer of the second transistor is greater than or equal to 0.16 and is less than or equal to 0.20.

11. The display device according to claim 10, wherein the ratio of the atomic percentage of gallium comprised in the second semiconductor layer of the second transistor to the atomic percentage of gallium comprised in the semiconductor layer of the blue light emitting diode is greater than or equal to 0.26 and is less than or equal to 0.50.

12. The display device according to claim 10, wherein the second semiconductor layer is in an amorphous phase.

13. The display device according to claim 10, wherein the second semiconductor layer is in a micro-crystal phase.

14. The display device according to claim 10, wherein a crystal size of the second semiconductor layer is less than 1 nm.

15. The display device according to claim 10, wherein the atomic percentage of gallium comprised in the semiconductor layer of the blue light emitting diode is greater than or equal to 0.40 and is less than or equal to 0.60.

16. The display device according to claim 10, wherein the atomic percentage of gallium comprised in the second semiconductor layer of the second transistor is greater than or equal to 0.176 and is less than or equal to 0.194.

17. A display device, comprising:

a substrate;

a first transistor disposed on the substrate, wherein the first transistor comprises a first semiconductor layer comprising silicon;

a second transistor disposed on the substrate, wherein the second transistor comprises a second semiconductor layer comprising gallium and oxygen; and a blue light emitting diode disposed on the substrate and electrically connected to the first transistor and the second transistor, wherein the blue light emitting diode comprises a semiconductor layer comprising gallium nitride, wherein a ratio of an atomic percentage of gallium comprised in the second semiconductor layer of the second transistor to an atomic percentage of gallium comprised in the semiconductor layer of the blue light emitting diode is greater than or equal to 0.26 and is less than or equal to 0.55, the first transistor is electrically connected to a scan line and a data line so as to serve as a signal receiving transistor, the second transistor is electrically connected between the first transistor and the blue light emitting diode, and the second transistor serves as a driving transistor, wherein the display device further comprises:

a third transistor disposed on the substrate, wherein the third transistor comprises a third semiconductor layer comprising gallium and oxygen; and a fourth transistor disposed on the substrate, wherein the fourth transistor comprises a fourth semiconductor layer comprising silicon, wherein the third transistor serves as a signal reset transistor, and the fourth transistor serves as a light emission control transistor, and when comparing the third semiconductor layer to the fourth semiconductor layer, the third semiconductor layer has a higher carrier mobility and the fourth semiconductor layer has a lower carrier mobility.

* * * * *